US010187012B1

(12) United States Patent
Radhakrishnan Kulasekaran

(10) Patent No.: US 10,187,012 B1
(45) Date of Patent: Jan. 22, 2019

(54) LOW VOLTAGE AMPLIFIER WITH GAIN BOOST CIRCUIT

(71) Applicant: TEXAS INSTRUMENTS INCORPORATED, Dallas, TX (US)

(72) Inventor: Bhuvanesh Radhakrishnan Kulasekaran, Kumbakonam (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/807,640

(22) Filed: Nov. 9, 2017

(51) Int. Cl.
*H03F 3/45* (2006.01)
*H03F 1/02* (2006.01)
*H03F 3/30* (2006.01)

(52) U.S. Cl.
CPC .......... *H03F 1/0205* (2013.01); *H03F 3/301* (2013.01); *H03F 3/45215* (2013.01); *H03F 3/45273* (2013.01); *H03F 3/45* (2013.01); *H03F 3/45071* (2013.01); *H03F 3/45085* (2013.01); *H03F 3/45183* (2013.01); *H03F 2200/411* (2013.01); *H03F 2203/45112* (2013.01)

(58) Field of Classification Search
CPC .... H03F 1/0205; H03F 3/301; H03F 3/45215; H03F 3/45273; H03F 2203/45112; H03F 2200/411; H03F 3/45183; H03F 3/45085; H03F 3/45071; H03F 3/45179; H03F 2203/30063; H03F 2203/45244
USPC .................................................. 330/253–261
See application file for complete search history.

(56) References Cited

U.S. PATENT DOCUMENTS

| 6,150,883 | A | * | 11/2000 | Ivanov | .................. | H03F 3/3028 330/253 |
| 6,356,153 | B1 | * | 3/2002 | Ivanov | .................. | H03F 3/3028 330/253 |
| 6,828,855 | B1 | * | 12/2004 | Wang | ...................... | H03F 1/308 330/253 |
| 7,443,237 | B1 | * | 10/2008 | Liu | ...................... | H03F 3/45192 330/253 |
| 8,836,428 | B2 | * | 9/2014 | Liu | ...................... | H03F 3/45076 330/254 |

OTHER PUBLICATIONS

De Langen, et al., "Compact Low-Voltage Power-Efficient Operational Amplifier Cells for VLSI," IEEE Journal of Solid-State Circuits, vol. 33, No. 10, Oct. 1998 (pp. 1482-1496).

* cited by examiner

*Primary Examiner* — Khanh V Nguyen
(74) *Attorney, Agent, or Firm* — John R. Pessetto; Charles A. Brill; Frank D. Cimino

(57) ABSTRACT

A class AB amplifier with improved DC gain. An amplifier includes an input stage and an output stage. The output stage is configured to amplify an output of the input stage. The output stage includes output transistors, class AB amplifier circuitry, minimum selector circuitry, and gain boost amplifier circuitry. The class AB amplifier circuitry includes a first transistor and a second transistor connected as a differential amplifier. The minimum selector circuitry is configured to control bias current in the output transistors by driving a control input of the first transistor. The gain boost amplifier circuitry is coupled to the class AB amplifier circuitry. The gain boost amplifier circuitry is configured to drive a common mode signal onto the control input of the first transistor and a control input of the second transistor, the common mode signal based on the output of the input stage.

20 Claims, 3 Drawing Sheets

LOW VOLTAGE AMPLIFIER WITH GAIN BOOST CIRCUIT

BACKGROUND

Of the many available electronic devices, operational amplifiers (op-amps) are some of the most widely used. Op-amps are efficient and versatile devices that can be used in a variety of applications, such as signal conditioning, analog instrumentation, analog computation, etc.

An op-amp may employ one of several different circuit arrangements. In one example, a class A amplifier reproduces an entire input signal because an active element of the class A amplifier, such as a transistor, is constantly in the active mode. Class A amplifiers typically have high power consumption because the active element constantly conducts current.

In another example, a class B amplifier typically employs two complementary output transistors, with each output transistor being turned on for half of the time and turned off for the other half of the time. That is, one output transistor operates as a current source, and the other output transistor operates as a current sink. This configuration is sometimes referred to as a "push-pull" configuration since a first branch of the output stage "pushes" or sources currents to a load while a second branch of the output stage "pulls" or sinks current from the load. A class B amplifier has lower power consumption than a class A amplifier but may be susceptible to crossover distortion due to the turn-on of one output transistor not matching the turn-off of the other output transistor.

A class AB amplifier also employs two complementary output transistors (similar to a class B amplifier). Class AB amplifiers avoid the high power consumption of a class A amplifier by always having one output branch substantially turn off when the other output branch is turned on. Although the current in one leg of a class AB amplifier is substantially turned off there is a small amount of current flowing in that lea. The small residual current in the class AB amplifier avoids the crossover distortion produced by the turning on and off of the currents in class B amplifiers. Thus, class AB amplifiers are able to achieve a relatively high current output while maintaining a low quiescent current. The currents in class AB amplifiers are inversely related such that when one current becomes large, the other current becomes very small.

SUMMARY

A class AB minimum selector amplifier with improved DC gain is disclosed herein. In one embodiment, an amplifier includes an input stage and an output stage. The output stage is configured to amplify an output of the input stage. The output stage includes class AB amplifier circuitry, minimum selector circuitry, and gain boost amplifier circuitry. The class AB amplifier circuitry is configured to drive the output transistors. The class AB amplifier circuitry includes a first transistor and a second transistor connected as a differential amplifier. The minimum selector circuitry is configured to control bias current in the output transistors by driving a control input of the first transistor. The gain boost amplifier circuitry is coupled to the class AB amplifier circuitry. The gain boost amplifier circuitry is configured to drive a common mode signal onto the control input of the first transistor and a control input of the second transistor, the common mode signal based on the output of the input stage.

In another embodiment, an output amplifier for use in a multi-stage operational amplifier includes output transistors, class AB minimum selector amplifier circuitry and gain boost amplifier circuitry. The class AB minimum selector amplifier circuitry includes a differential class AB amplifier and minimum selector circuitry. The differential class AB amplifier includes a first stacked pair of complementary transistors, and a second stacked pair of complementary transistors. The minimum selector circuitry is configured to control bias current in the output transistors by driving a control input of a first transistor of the first stacked pair of complementary transistors. The gain boost amplifier circuitry is coupled to the class AB minimum selector amplifier circuitry. The gain boost amplifier circuitry is configured to receive a differential input signal to be amplified by the output amplifier, to generate a common mode signal to drive the control input of the first transistor of the first stacked pair of complementary transistors, and to drive a control input of a first transistor of the second stacked pair of complementary transistors.

In a further embodiment, a two-stage operational amplifier includes a differential input stage, and an output stage coupled to the input stage. The output stage is configured to amplify a differential output of the input stage. The output stage includes output transistors, class AB minimum selector amplifier circuitry and gain boost amplifier circuitry. The class AB minimum selector amplifier circuitry includes a differential class AB amplifier and minimum selector circuitry. The differential class AB amplifier includes a first stacked pair of complementary transistors, and a second stacked pair of complementary transistors. The minimum selector circuitry is configured to control bias current in the output transistors by driving a control input of a first transistor of the first stacked pair of complementary transistors. The gain boost amplifier circuitry is coupled to the class AB minimum selector amplifier circuitry. The gain boost amplifier circuitry includes a first input transistor and a second input transistor connected as a differential pair to receive the differential output of the input stage. The gain boost amplifier circuitry also includes third and fourth transistors coupled to the first input transistor and the second input transistor. The third and fourth transistors are connected as a differential-to-single-ended converter to convert output of the first and second transistors to a single-ended signal. The gain boost amplifier circuitry further includes fifth and sixth transistors coupled to an output of the differential-to-single-ended converter. Each of the fifth and sixth transistors is configured to convert a voltage input to a current output. An output of the fifth transistor is coupled to the control input of the first transistor of the first stacked pair of complementary transistors. An output of the sixth transistor is coupled to a control input of a first transistor of the second stacked pair of complementary transistors.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different parties may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Operational amplifiers are frequently used in battery power devices or systems in which it is desirable to minimize the energy consumed by the amplifier (e.g., to maximize the operational life of the battery). Reduction of energy consumption is often accomplished by lowering the power supply voltages provided to the operational amplifier. A number of additional features, in addition to the ability to operate at low power supply voltages (e.g., >2.1 volts), are required in modern operational amplifiers. For example, an operational amplifier may be required to drive a capacitive load in excess of 100 picofarads and simultaneously provide high DC gain. Some conventional operational amplifiers may cascade three or more amplifier stages to provide high DC gain. Unfortunately, cascading three amplifier stages can significantly increase circuit area and reduce the amplifier's ability to drive a capacitive load for a given quiescent current. Conventional two-stage operational amplifiers can provide good capacitive load drive, but suffer from poor DC gain at low power supply voltages.

Embodiments of the present disclosure include a two-stage amplifier that provides DC gain that is substantially (e.g., 30-40 decibels (dB)) higher than conventional two-stage amplifiers. The embodiments disclosed herein include a rail-to-rail amplifier implemented as a class AB minimum selector amplifier with a gain boost amplifier that provides increased DC gain. The gain boost amplifier includes a pair of outputs. Each output individually controls that one of the low-side transistors of the class AB amplifier. The control signals are provided as common mode currents to enable gain boosting without disturbing the differential signal at the inputs of the low-side transistors. By including the gain boost amplifier, the two-stage amplifier circuits disclosed herein provide both good capacitive drive and high DC gain.

Figure 1:
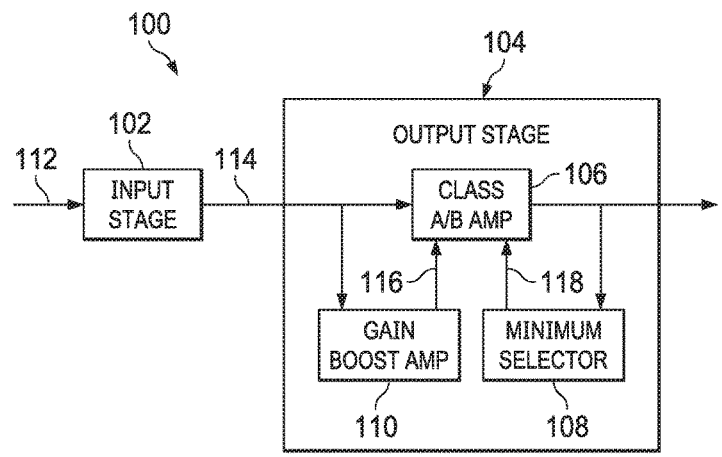
FIG. 1 shows a block diagram of a class AB minimum selector amplifier with a gain boost amplifier that increases DC gain in accordance with various embodiments.

FIG. 1 shows a block diagram of a class AB minimum selector amplifier 100 that includes a gain boost amplifier that increases DC gain in accordance with various embodiments. The amplifier 100 includes an input stage 102 and an output state 104. The input stage 102 receives an input signal 112 to be amplified, applies gain to the input signal 112 to produce amplified signal 114, and passes the amplified signal 114 to the output stage 104. The input signal 112 and the amplified signal 114 may be differential.

The output stage 104 includes class AB amplifier circuitry 106, minimum selector circuitry 108, and gain boost amplifier circuitry 110. The class AB amplifier circuitry 106 further amplifies the signal 114 received from the input stage 102. The minimum selector circuitry 106 monitors the bias currents flowing in output transistors of the output stage 104, identifies the lower of the bias currents flowing in the output transistors, and provides a feedback signal 118 to the class AB amplifier circuitry 106 that causes the class AB amplifier circuitry 106 to provide at least a predetermined minimum bias current to the output transistors.

The gain boost amplifier circuitry 110 is coupled to the class AB amplifier circuitry 106. The gain boost amplifier circuitry 110 receives the signal 114 generated by the input stage 102 and produces signals 116 that drive the low-side transistors of the class AB amplifier circuitry 106 with a common mode signal. By driving the low-side transistors with a common mode signal, the gain boost amplifier circuitry 110 provides increased gain without disturbing the differential mode signal driving the low-side transistors of the class AB amplifier circuitry 106. Embodiments of the gain boost amplifier circuitry 110 may increase the gain of the amplifier 100 by 30-40 dB relative to conventional two stage amplifiers.

Figure 2:
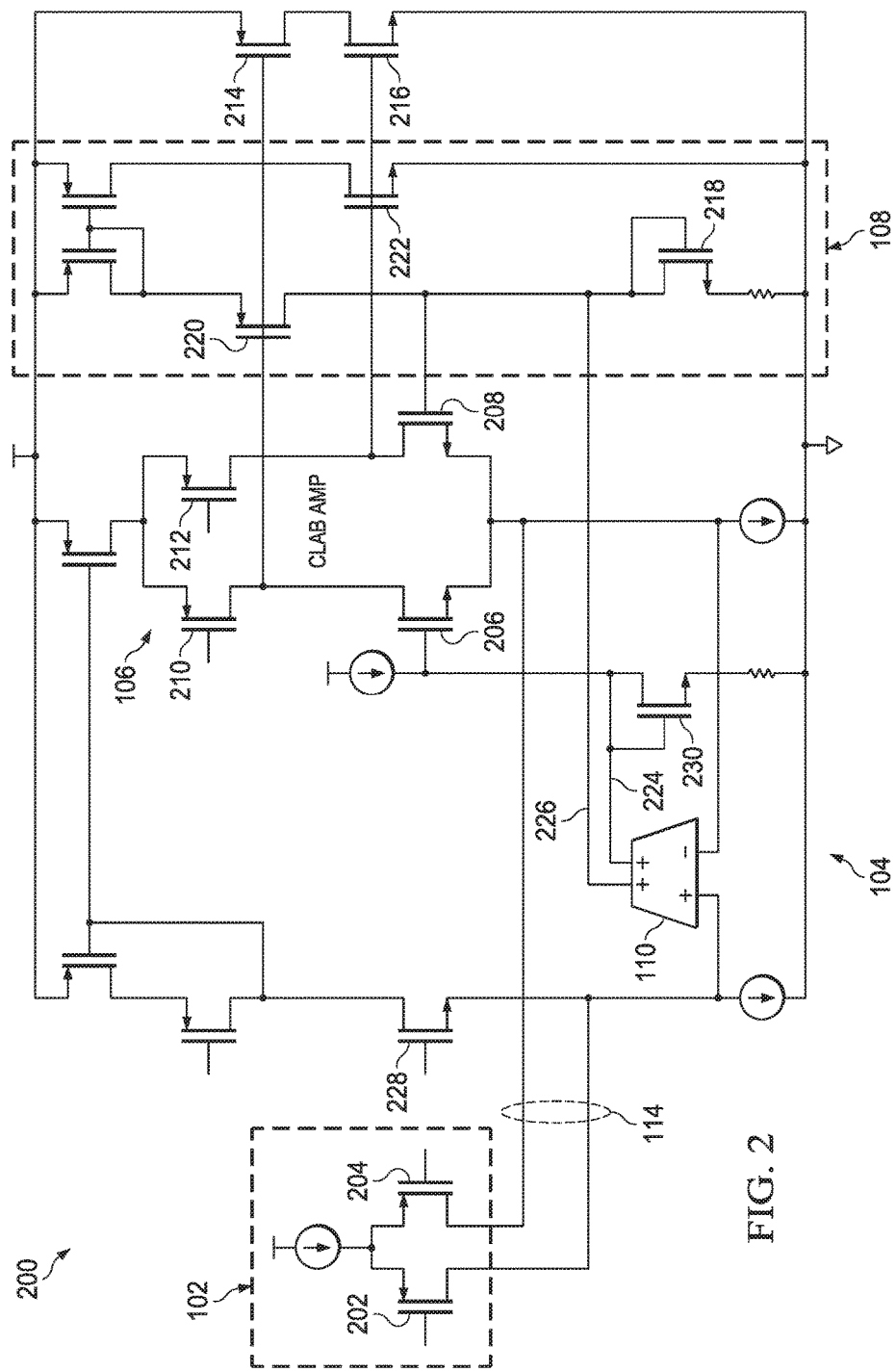
FIG. 2 shows a schematic diagram of a class AB minimum selector amplifier with a gain boost amplifier that increases DC gain in accordance with various embodiments.

FIG. 2 shows a schematic diagram of an amplifier 200 in accordance with various embodiments. The amplifier 200 is an embodiment of the amplifier 100. The amplifier 200 includes an input stage 102 and an output stage 104. The input stage 102 include transistors 202 and 204 connected as a differential pair. Transistors 202 and 204 may be p-channel metal oxide semiconductor field effect transistors (MOSFETs). The input stage 102 receives a differential signal, amplifies the differential signal, and provides the amplified differential signal 114 to the output stage 104.

The output stage 104 includes class AB amplifier circuitry 106, minimum selector circuitry 108, gain boost amplifier circuitry 110, and output transistors 214 and 216. The class AB amplifier circuitry 106 includes low-side transistors 206 and 208, and high-side transistors 210 and 212. Low-side transistors 206 and 208 form a differential pair and high-side transistors 210 and 212 are the current loads for the differential pair 206, 208. The low-side transistors 206 and 208 may be N-channel MOSFETs and the high-side transistors 210 and 212 may be p-channel MOSFETs. Low-side transistor 206 and high-side transistor 210 form a complementary pair, and low-side transistor 208 and high-side transistor 212 form a complementary pair. The output transistors 214 and 216 form a complementary pair, where transistor 214 may be a p-channel MOSFET and transistor 216 may be an n-channel MOSFET. A node formed at the connected drains of the transistors 206 and 210 drives the gate terminal of the output transistor 214, and a node formed at the connected drains of the transistors 208 and 212 drives the gate terminal of the output transistor 216. The diode connected transistor 230 provides a reference voltage at the gate of the low-side transistor 206.

The minimum selector circuitry 108 includes transistors 220 and 222 that respectively monitor the bias currents in the output transistors 214 and 216. Current flowing in the drain of transistor 220 is the output of the minimum selector circuitry 108 and flows in the diode connected transistor 218 to generate a feedback signal on the gate of the low-side transistor 208. The feedback signal causes the class AB amplifier circuitry 106 to drive the gates of the output transistors 214 and 216 such that the current through the diode connected transistor 218 is equal to the current through the diode connected transistor 230, and a predetermined minimum bias current flows in the output transistors 214 and 216. Thus, class AB operation is regulated by the differential signal provided across the gates of the low-side transistors 206 and 208.

The gain boost amplifier circuitry 110 receives as inputs the amplified differential signal produced by the input stage 102, further amplifies the received signal, and provides output signals to drive the class AB amplifier circuitry 106. Because the gates of the low-side transistors 206 and 208 of the class AB amplifier circuitry 106 are diode connected for class AB operation (i.e., the gates of transistors 206 and 208 are connected to diodes 230 and 218 respectively), the gain boost amplifier circuitry 110 provides two output signals 224 and 226 to separately control the low-side transistors 206 and 208. Output signal 224 drives the gate of the low-side transistor 206 of the class AB amplifier circuitry 106. Output signal 226 drives the gate of the low-side transistor 208 of the class AB amplifier circuitry 106. The output signals 224 and 226 are common mode signals that enable the gain boost amplifier circuitry 110 to increase the gain of the amplifier 100 without disturbing the differential signal on the gates of the low-side drive transistors 206 and 208 that provide class AB operation. The bandwidth of the gain boost amplifier circuitry 110 may be substantially lower (e.g., 1/10) of the bandwidth of the class AB amplifier circuitry 106 to avoid large transients on the gates of the low-side transistors 206 and 208 during load transients. The lower bandwidth also reduces the power consumption of the gain boost amplifier circuitry 110. Inclusion of the gain boost amplifier circuitry 110 can increase the DC gain of the amplifier 100 by 30-40 dB relative to two-stage amplifier implementations that lack the gain boost amplifier circuitry 110.

Figure 3:
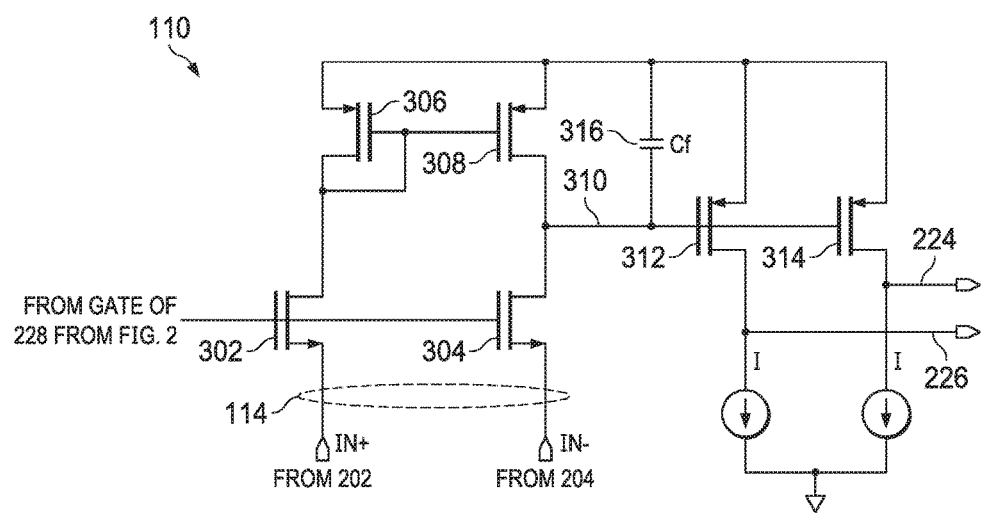
FIG. 3 shows a schematic diagram of a gain boost amplifier suitable for increasing the DC gain of class AB minimum selector amplifier in accordance with various embodiments.

FIG. 3 shows a schematic diagram of the gain boost amplifier circuitry 110 in accordance with various embodiments. The gain boost amplifier circuitry 110 includes input transistors 302 and 304 connected as a differential pair. The input transistors 302 and 304 may be n-channel MOSFETs. The gate terminals of the input transistors 302 and 304 are connected to the gate terminal of the transistor 228 of the class AB amplifier circuitry 106 (i.e., connected to a bias voltage source). The width-length ratio of the transistors 302, 304 to the transistor 228 sets the bias currents in transistors 302 and 304. Transistors 306 and 308 are connected to the outputs of the input transistors 302 and 304, and perform differential-to-single-ended conversion of the signal output of the differential pair (transistors 302 and 304). A compensation capacitor 316 is connected to the single-ended signal 310 to provide dominant pole compensation to the gain boost amplifier circuitry 110 (i.e., to reduce the bandwidth of the gain boost amplifier circuitry 110 relative to the bandwidth of the class AB amplifier circuitry 106).

The single-ended signal 310 produced at the connected drains of the transistors 304 and 308 drives the gates of the output transistors 314 and 316. The output transistor 314 produces signal 224 that drives the gate of the low-side transistor 206 of the class AB amplifier circuitry 106, and the output transistor 312 produces signal 226 that drives the gate of the low-side transistor 208 of the class AB amplifier circuitry 106. The output transistors 312 and 314 are identical transistors, each of which operates as an independent voltage-to-current converter that adjusts the reference voltage at the gate of the low-side transistor 206 or 208 to which the output transistor 312 or 314 is connected. The output transistors 312 and 314 are biased with identical small currents to ensure operation under transient loading conditions.

While the gain boost amplifier circuitry 110 is illustrated in FIG. 3 as including a single gain stage, some embodiments of the gain boost amplifier 110 may include multiple nested gain stages for further improve the DC gain of the amplifier 100.

Figure 4:
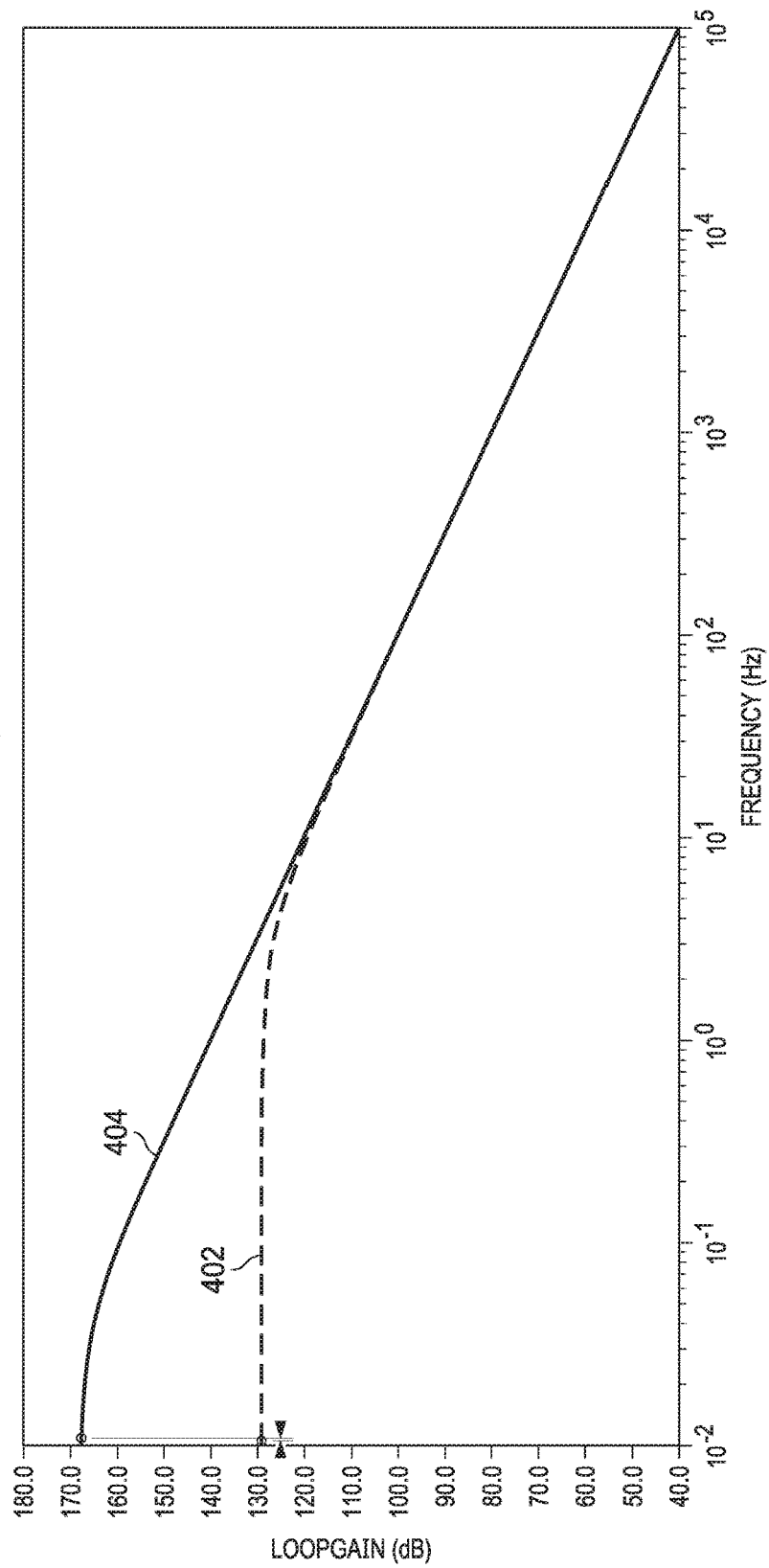
FIG. 4 shows a comparison of gain of a conventional class AB minimum selector amplifier and gain of a class AB minimum selector amplifier with a gain boost amplifier in accordance with various embodiments.

FIG. 4 shows a comparison of gain of a conventional of class AB minimum selector amplifier and gain of a class AB minimum selector amplifier 100 that includes the gain boost amplifier circuitry 110 in accordance with various embodiments. In FIG. 4, curve 402 represents the gain of a class AB minimum selector amplifier that lacks the gain boost amplifier circuitry 110, and curve 404 represents the gain of the amplifier 100. FIG. 4 shows that the amplifier 100 provides about 37 dB higher gain at frequencies approaching DC (e.g., about 0.01 Hz in FIG. 4) than the class AB minimum selector amplifier that lacks the gain boost amplifier circuitry 110. Some embodiments of the amplifier 100 may provide even higher DC gain.

The above discussion is meant to be illustrative of the principles and various embodiments of the present invention. Numerous variations and modifications will become apparent to those skilled in the art once the above disclosure is fully appreciated. For example, the schematic representations of the input stage 102, the class AB amplifier circuitry 106, the minimum selector circuitry 108, and the gain boost amplifier circuitry 110 provided herein represent examples of the circuitry that may be implemented in the amplifier 100. Some embodiments of the amplifier 100 may include different circuitry to implement the input stage 102, the class AB amplifier circuitry 106, the minimum selector circuitry 108, and/or the gain boost amplifier circuitry 110. It is intended that the following claims be interpreted to embrace all such variations and modifications.

What is claimed is:

1. An amplifier, comprising:
   an input stage; and
   an output stage configured to amplify an output of the input stage, the output stage comprising:
      output transistors;
      class AB amplifier circuitry configured to drive the output transistors, the class AB amplifier circuitry comprising a first transistor and a second transistor connected as a differential amplifier;
      minimum selector circuitry configured to control bias current in the output transistors by driving a control input of the first transistor;
      gain boost amplifier circuitry coupled to the class AB amplifier circuitry, the gain boost amplifier circuitry configured to drive a common mode signal onto the control input of the first transistor and a control input of the second transistor, the common mode signal based on the output of the input stage.

2. The amplifier of claim 1, wherein the gain boost amplifier circuitry comprises differential input circuitry configured to:
   receive the output of the input stage; and
   convert a differential output of the input stage to a single-ended signal.

3. The amplifier of claim 2, wherein the gain boost amplifier circuitry comprises:
   a first voltage-to-current converter configured to generate, based on the single-ended signal, a first signal to drive the control input of the first transistor;

a second voltage-to-current converter configured to generate, based on the single-ended signal, a second signal to drive the control input of the second transistor;
wherein the common mode signal comprises the first signal and the second signal.

4. The amplifier of claim 3, wherein the first voltage-to-current converter and the second voltage-to-current converter comprise transistors of same physical dimensions that are biased by a same value of current.

5. The amplifier of claim 2, wherein the gain boost amplifier circuitry comprises a frequency compensation capacitor coupled to an output of the differential input circuitry, the frequency compensation capacitor selected to set a bandwidth of the gain boost amplifier circuitry to be lower than a bandwidth of the class AB amplifier circuitry.

6. The amplifier of claim 5, wherein the bandwidth of the gain boost amplifier circuitry is no more than $1/10$ of the bandwidth of the class AB amplifier circuitry.

7. The amplifier of claim 1, wherein each of the first transistor and the second transistor is a low-side transistor of a stacked complementary pair of transistors.

8. The amplifier of claim 1, wherein each of the first transistor and the second transistor is an N-channel field effect transistor and the control input is a gate terminal.

9. An output amplifier for use in a multi-stage operational amplifier, the output amplifier comprising:
output transistors;
class AB minimum selector amplifier circuitry comprising:
a differential class AB amplifier comprising:
a first stacked pair of complementary transistors; and
a second stacked pair of complementary transistors;
minimum selector circuitry configured to control bias current in the output transistors by driving a control input of a first transistor of the first stacked pair of complementary transistors; and
gain boost amplifier circuitry coupled to the class AB minimum selector amplifier circuitry, the gain boost amplifier circuitry configured to:
receive a differential input signal to be amplified by the output amplifier; and
generate a common mode signal to drive the control input of the first transistor of the first stacked pair of complementary transistors and to drive a control input of a first transistor of the second stacked pair of complementary transistors.

10. The output amplifier of claim 9, wherein the gain boost amplifier circuitry comprises a first input transistor and a second input transistor connected as a differential pair to receive the differential input signal.

11. The amplifier of claim 10, wherein the gain boost amplifier circuitry comprises a frequency compensation capacitor coupled to an output of the first input transistor, the frequency compensation capacitor selected to set a bandwidth of the gain boost amplifier circuitry to be lower than a bandwidth of the class AB minimum selector amplifier circuitry.

12. The amplifier of claim 11, wherein the bandwidth of the gain boost amplifier circuitry is no more than $1/10$ of the bandwidth of the class AB minimum selector amplifier circuitry.

13. The output amplifier of claim 10, wherein the gain boost amplifier circuitry comprises third and fourth transistors coupled to the first input transistor and the second input transistor, the third and fourth transistors connected as a differential-to-single-ended converter to convert the differential input signal to a single-ended signal.

14. The output amplifier of claim 13, wherein the gain boost amplifier circuitry comprises a first voltage-to-current converter configured to generate, based on the single-ended signal, the common mode signal to drive the control input of the first transistor of the first stacked pair of complementary transistors.

15. The output amplifier of claim 14, wherein the gain boost amplifier circuitry comprises a second voltage-to-current converter configured to generate, based on the single-ended signal, the common mode signal to drive the control input of the first transistor of the second stacked pair of complementary transistors.

16. The output amplifier of claim 15, wherein the first voltage-to-current converter and the second voltage-to-current converter comprise:
transistors of same physical dimensions; and
bias current generation circuitry to generate a same value of bias current for the first voltage-to-current converter and the second voltage-to-current converter.

17. The amplifier of claim 9, wherein the first transistor of the first stacked pair of complementary transistors and the first transistor of the second stacked pair of complementary transistors are low-side transistors.

18. A two-stage operational amplifier, comprising:
a differential input stage; and
an output stage coupled to the input stage and configured to amplify a differential output of the input stage, the output stage comprising:
output transistors;
class AB minimum selector amplifier circuitry comprising:
a differential class AB amplifier comprising:
a first stacked pair of complementary transistors; and
a second stacked pair of complementary transistors;
minimum selector circuitry configured to control bias current in the output transistors by driving a control input of a first transistor of the first stacked pair of complementary transistors; and
gain boost amplifier circuitry coupled to the class AB minimum selector amplifier circuitry, the gain boost amplifier circuitry comprising:
a first input transistor and a second input transistor connected as a differential pair to receive the differential output of the input stage;
third and fourth transistors coupled to the first input transistor and the second input transistor, the third and fourth transistors connected as a differential-to-single-ended converter to convert output of the first and second input transistors to a single-ended signal; and
fifth and sixth transistors coupled to an output of the differential-to-single-ended converter, each of the fifth and sixth transistors configured to convert a voltage input to a current output;
wherein:
an output of the fifth transistor is coupled to the control input of the first transistor of the first stacked pair of complementary transistors; and
an output of the sixth transistor is coupled to a control input of a first transistor of the second stacked pair of complementary transistors.

19. The two-stage operational amplifier of claim 18, wherein the gain boost amplifier circuitry comprises a frequency compensation capacitor coupled to an output of the differential-to-single-ended converter, the frequency compensation capacitor selected to set a bandwidth of the gain boost amplifier circuitry to be lower than a bandwidth of the class AB minimum selector amplifier circuitry.

20. The two-stage operational amplifier of claim 19, wherein the bandwidth of the gain boost amplifier circuitry is no more than 1/10 of the bandwidth of the class AB minimum selector amplifier circuitry.

* * * * *